United States Patent
Speier (10) Patent No.: US 10,520,574 B2
(45) Date of Patent: Dec. 31, 2019

(54) DETERMINING DIFFUSION TENSORS USING MAGNETIC RESONANCE TOMOGRAPHY SCANNERS

(71) Applicant: Peter Speier, Erlangen (DE)

(72) Inventor: Peter Speier, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 118 days.

(21) Appl. No.: 15/652,682

(22) Filed: Jul. 18, 2017

(65) Prior Publication Data

US 2018/0031664 A1 Feb. 1, 2018

(30) Foreign Application Priority Data

Jul. 28, 2016 (DE) .................. 10 2016 213 926

(51) Int. Cl.
*G01V 3/00* (2006.01)
*G01R 33/563* (2006.01)

(52) U.S. Cl.
CPC .............................. *G01R 33/56341* (2013.01)

(58) Field of Classification Search
CPC ............. G01R 33/543; G01R 33/5659; G01R 33/3415; G01R 33/36; A61B 5/055
USPC ........................................................ 324/309
See application file for complete search history.

(56) References Cited

U.S. PATENT DOCUMENTS

| | | | |
|---|---|---|---|
| 6,441,821 B1* | 8/2002 | Nagasawa | G06T 15/00 345/424 |
| 2005/0240097 A1* | 10/2005 | Lange | G01R 33/56341 600/410 |
| 2009/0058417 A1 | 3/2009 | Yanasak et al. | |
| 2009/0156521 A1* | 6/2009 | Abbracchio | C12N 15/1138 514/44 R |
| 2014/0081659 A1* | 3/2014 | Nawana | G16H 50/20 705/3 |

(Continued)

FOREIGN PATENT DOCUMENTS

EP 2933743 A1 10/2015

OTHER PUBLICATIONS

Clark Chris A. et al: "Diffusion Imaging of the Spinal Cord In Vivo: Estimation of the Principal Diffusivities and Application to Multiple Sclerosis"; Magnetic Resonance in Medicine 43: 133-138 (2000); pp. 133-138.

*Primary Examiner* — Walter L Lindsay, Jr.
*Assistant Examiner* — Frederick Wenderoth
(74) *Attorney, Agent, or Firm* — Lempia Summerfield Katz LLC (57) ABSTRACT

A magnetic resonance tomography scanner is provided for the determination a diffusion tensor of an examination object, and a method is provided for operating the magnetic resonance tomography scanner. The magnetic resonance tomography scanner acquires a volume image of the examination object by imaging magnetic resonance tomography without diffusion encoding. The control system segments the image according to diffusion-relevant symmetry properties and also determines volume elements of a symmetry group. A first and a second component of a diffusion tensor are acquired by the magnetic resonance tomography scanner at different angles and the control unit uses the symmetry property with the acquired components and the volume image to determine a diffusion tensor for the volume elements.

15 Claims, 4 Drawing Sheets

(56) References Cited

U.S. PATENT DOCUMENTS

| | | | |
|---|---|---|---|
| 2015/0133826 A1* | 5/2015 | Viitala | A61N 7/02 601/3 |
| 2015/0241526 A1* | 8/2015 | Speier | A61B 5/02028 324/309 |
| 2015/0379713 A1* | 12/2015 | Puybasset | G06T 7/238 382/131 |

* cited by examiner

DETERMINING DIFFUSION TENSORS USING MAGNETIC RESONANCE TOMOGRAPHY SCANNERS

The application claims the benefit of German Patent Application No. DE 10 2016 213 926.6, filed Jul. 28, 2016, which is hereby incorporated by reference in its entirety.

TECHNICAL FIELD

The disclosure relates to a method for diffusion tensor determination of an examination object with a magnetic resonance tomography scanner and a magnetic resonance tomography scanner for carrying out the method. The method entails the acquisition of a volume image of the examination object without diffusion encoding and a volume image with first diffusion encoding in a first spatial direction to a second component of the diffusion tensor.

BACKGROUND

Magnetic resonance tomography scanners are imaging devices that, in order to depict an examination object, align nuclear spins of the examination object with a strong outer magnetic field and by way of a magnetic alternating field execute the same for precession about this alignment. The precession or return of the spins from this excited state into a state with less energy in turn generates, as a response, a magnetic alternating field that is received via antennas.

With the aid of magnetic gradient fields, a spatial encoding is imprinted on the signals, which subsequently allows the received signal to be assigned to a volume element. The received signal is then evaluated and a three-dimensional imaging depiction of the examination object is provided. The depiction generated indicates a spatial density distribution of the spins.

Diffusion of substances in the examination object, (e.g., water or hydrogen-containing substances), is described by a diffusion tensor, which may be depicted as a symmetric diffusion matrix with 3 ×3 components, 6 of which are independent. To determine the tensor, in the prior art, first an image of the density distribution of the substance to be examined, (e.g., hydrogen), is generated. This is the case, for example, with conventional magnetic resonance tomography. For determination of the individual components of the diffusion tensor, it is then necessary, to acquire the change in proton density with time quantitatively due to drift in different directions. To this end, after excitation by a gradient field, the protons are subject to location- and direction-dependent phase modulation and the phase modulation is reversed after a measuring interval. In the case of protons, which have then left the original location in the direction of the encoding, for example due to diffusion, the phase modulation reversal is incomplete and the protons then contribute with reduced intensity to the subsequently determined density distribution. This reduction and, from this, a component of the tensor may be determined by quotient formation.

Overall, in addition to unencoded density measurement, 6 further measurements with different encoding directions are necessary for the determination of all components of the diffusion tensor. Due to the small change in density due to diffusion, the signal-to-noise-ratio, SNR) in the measurements is much worse than with simple density measurements. Therefore, to produce useful measurements, it is necessary to take a plurality of measurements and calculate the average thereof thus significantly extending the measuring time.

SUMMARY AND DESCRIPTION

The scope of the present disclosure is defined solely by the appended claims and is not affected to any degree by the statements within this description. The present embodiments may obviate one or more of the drawbacks or limitations in the related art.

It is an object of the present disclosure to provide a method and a device that expedite the determination of the diffusion tensor.

The method for diffusion tensor determination of an examination object with a magnetic resonance tomography scanner has the act of acquiring a volume image of the examination object by imaging magnetic resonance tomography without diffusion encoding. For the purpose of the disclosure, this should be understood to refer to any image that provides a value for the volume elements of the examination object correlating with a density of the substance or element for which a diffusion tensor is to be determined. Herein, an examination object may also be a sub-region or sub-volume of a larger object, (e.g., an organ, blood vessel, muscle or the like). Herein, the volume may also be a thin, flat slice, in each case with a thickness of one volume element, for example.

Herein, "without diffusion encoding" should be understood as meaning that the diffusion sensitivity of the volume image is much lower than that of the subsequently described diffusion-sensitive images. For example, a diffusion-sensitive component of the measured value of the volume image is less than 50%, 20%, 10%, 5%, or 1% of a diffusion-sensitive image. The reason for this is that, to stabilize the image quality, gradients are played out which themselves give rise to stronger or weak diffusion encoding. However, it is also possible to use a reference with significant encoding in order to exclude superimposed effects from the diffusion, such as, for example, intra voxel incoherent motion (IVIM) =flow in capillaries.

In another act of the method, the volume image is segmented and a diffusion-relevant first symmetry property of the examination object is determined in a plane of symmetry. Here, "plane of symmetry" does not refer to a plane that is a mirror plane for mirror symmetry, but a plane, or two-dimensional surface, in which symmetry elements with a common symmetry property are arranged. For example, an image-recognition algorithm in the magnetic resonance tomography scanner control system may identify muscles or blood vessels in the volume image, for example, from contrasts and edge detection in conjunction with a relative position in a patient's body and a database with comparative data. Symmetry properties are known for the identified objects, for example, in a cross section through a vein, the cells in a wall follow the morphology of the vein, which is substantially rotationally symmetrical to a center point of the vein, wherein the cross section through the vein simultaneously forms the plane of symmetry. The same also applies, for example, to muscle fibers with a morphology that is rotationally symmetrical to a plane of symmetry produced by a cross section transverse to the longitudinal extension.

Herein, for the purposes of the disclosure, it should not be understood that the position or exact shape of individual cells corresponds exactly to a mirror, point, or axial symmetry but that the properties of the cells at locations described as symmetrical are symmetrical with respect to diffusion and may be mapped onto one another by symmetric mapping. Herein, account should be taken of the fact that magnetic resonance tomography, and in particular also with the method, may not able to spatially resolve individual cells, but only determine a mean spin density from a plurality of cells. Correspondingly, measured values determined in the method are also only averaged over a plurality of cells. The alignment and shape of individual cells may have a macroscopic morphology so that symmetry properties with respect to diffusion may also be determined from macroscopic segmentation of a magnetic resonance image.

In another act of the method, a first symmetry group of volume elements of the examination object with the first symmetry property is determined, e.g., a set of volume elements for which the first symmetry operation may transform diffusion properties into each another. In the above-described example of a vein, the symmetry group may entail volume elements with cells in the middle of the wall of the vein or on the internal surface or external surface. Rotation about the center point of the round cross section of the vein causes these volume elements each to be mapped again onto volume elements with substantially the same properties.

In another act of the method, in a first image, a first component of the diffusion tensor is acquired in a first direction at a first angle to the plane of symmetry. Herein, the first component of the diffusion tensor does not necessarily correspond directly to a matrix element of the diffusion tensor in the Cartesian coordinate system, but to a matrix element of a tensor in a coordinate system, which is determined by the selected spatial directions of the first image and the subsequently described second image. The two diffusion tensors may be transformed into each other by coordinate transformation.

Herein, the first angle is unequal to zero and unequal to 90 degrees. The angle may be significantly different from a zero or right angle, the value is for example greater than 10, 20, or 30 degrees. For acquisition, it may be possible for a slice of volume elements to be excited in or parallel to the plane of symmetry through an applied gradient field perpendicular to the plane of symmetry. A magnetic field gradient pulse with a first direction and a magnetic field gradient pulse opposite to the first direction following after a time interval may generate spin encoding that is sensitive to diffusion in the first direction. It is then, (e.g., by an EPI sequence), possible to acquire a value representing a diffusion tensor component in the first direction for each volume element of the examination object. For example, it is possible for a value to be acquired that corresponds to the spin density for spins which were in the volume element in the time interval and simultaneously have not left a sub-volume determined by the diffusion-sensitive encoding. Herein, the diffusion-sensitive sub-volume is much smaller than the volume elements in magnetic resonance imaging; for example, diffusion movements may be acquired quantitatively in the order of magnitude of one cell, but integrally for all the spins contained in the volume element of the magnetic resonance imaging.

In a further act of the method, in a second image, a second component of the diffusion tensor is acquired in a second direction at a second angle to the plane of symmetry. Herein, the magnitude of the second angle differs from that first angle, e.g., not only in the preceding sign. The magnitude of the second angle may differ from the magnitude of the first angle by a value greater than 10, 20, or 30 degrees. The acquisition of the second image is substantially identical to the acquisition of the first image.

In a further act of the method, a diffusion tensor of a first volume element of the first symmetry group is determined from the volume image, the first image, and the second image. Herein, the volume image indicates a reference value without a diffusion component.

A conventional determination of the diffusion tensor requires a total of 6 images with different diffusion-sensitive encoding in different spatial directions plus additionally a diffusion-independent volume image as a reference value.

However, in the method, utilization is made of the symmetry and measurements in additional spatial directions are replaced by measurements for other volume elements of the first symmetry group. To this end, the first components of the diffusion tensor acquired in the first image and the second components of the diffusion tensor acquired in the second image from a plurality of second volume elements of the first symmetry group are mapped onto the first volume element by symmetry mapping dependent upon the symmetry, the position of the first volume element, and the position of the second volume element, and optionally averaged. Herein, the first volume element and the second volume element are not identical; their positions are different.

Let two volume elements A and B of the first symmetry group be used as an example. The center point M of the circular cross section of the vein and the volume element A in the wall of the vein define a first straight line in the plane of symmetry. To this end, the volume element B is arranged at a right angle in the wall of the vein. Herein, due to the symmetry properties, it is possible to use a measured value for B instead of a measured value for A in a spatial direction rotated by 90 degrees. Herein, the diffusion-tensor components acquired with individual diffusion encoding in a first direction simultaneously for volume elements A and B correspond to two diffusion-tensor components for the volume element A, which correspond to two diffusion-encoding directions rotated by 90 degrees with respect to one another in the plane of symmetry. Therefore, measured values for different angles in the plane of symmetry are provided from one individual image acquisition in a number corresponding to the number of volume elements in the first symmetry group. It is only necessary to map the measured values, which are both vectors, on the respective other measured value by a symmetry operation according to the symmetry property. Herein, the symmetry operation is also dependent upon the respective position of the first and second volume element. In the example of rotational symmetry, the symmetry operation is a rotation represented by a matrix and the position of the first and of the second volume element is specified by the radius and the respective azimuth angle.

Herein, more complex symmetries and symmetry operations are also conceivable. Also possible are symmetries not only in one plane of symmetry, but also three-dimensional symmetries. If, in the plane of symmetry, measured values are not only determined for two volume elements at two angles with respect to the plane, but from a plurality of volume elements with a plurality of angles in one measurement, the equation system for the determination of the diffusion-tensor components is over-determined. The additional information may therefore be advantageously used for averaging as early as during the determination of the diffusion-tensor components and hence to obtain a result with a better SNR. Overall, there is advantageously a reduction in the number of measurements and the measuring time for the determination of the diffusion tensor together with a better result.

The magnetic resonance tomography scanner shares the advantages of the method.

In one possible embodiment of the method, the act of the determination of the diffusion tensor is repeated for another first volume element.

Advantageously, the symmetry properties may be used to determine the diffusion tensor for all elements of the symmetry group without additional measurements.

In one conceivable embodiment of the method, the acts of the segmentation of a volume image and determination of the diffusion tensor are repeated for a plurality of symmetry groups.

In the case of complex examination objects with a plurality of different symmetries, the method may advantageously be configured to different symmetries and thus, for example, a value for the course of a curved vessel may also be determined. If the first image and the second image have already been acquired and stored for a volume that also includes the regions of the examination object with the plurality of symmetry groups, there is no need to repeat the acquisition and to use the stored data. However, it also conceivable, in each case to repeat an acquisition of the first image and the second image for a small volume with one or more of the symmetry groups and thus save storage space.

In one possible embodiment of the method, the act of the acquisition of an image of a component of the diffusion tensor is repeated for a plurality of angles. Advantageously, the number of angles acquired is accompanied by an improvement in the signal-noise ratio of the specific diffusion tensor. It is moreover conceivable for the measured values to be stored to enable a diffusion tensor determination to be performed subsequently from the measured data already determined at a later time for different symmetry groups and symmetries.

In one conceivable embodiment of the method, the diffusion tensor is determined completely with six or fewer magnetic resonance images.

Advantageously, the method may be used to determine a diffusion tensor more quickly and efficiently with a lower number than the seven images required with a conventional procedure.

In one possible embodiment of the method, the diffusion tensor is determined completely with four magnetic resonance images.

The method enables the complete determination of diffusion tensors using the symmetry with only three images: two diffusion-encoded and one diffusion-independent reference measurement.

In one conceivable embodiment of the method, the method includes the act of the acquisition of a third image of a third component of the diffusion tensor in a third direction at a third angle to the plane of symmetry. Herein, the magnitude of the third angle differs from that of the first angle and the second angle and the first direction, the second direction and the third direction span an orthogonal coordinate system.

During diffusion encoding, the method additionally and without the assumption of symmetry uses the three directions standing perpendicular to one another to determine a scalar diffusion constant, known as the "apparent diffusion coefficient" (ADC) for all volume elements.

BRIEF DESCRIPTION OF THE DRAWINGS

Further advantages and details may be derived from the following description of exemplary embodiments in conjunction with the drawings, which show as schematic representations.

DETAILED DESCRIPTION

Figure 1:
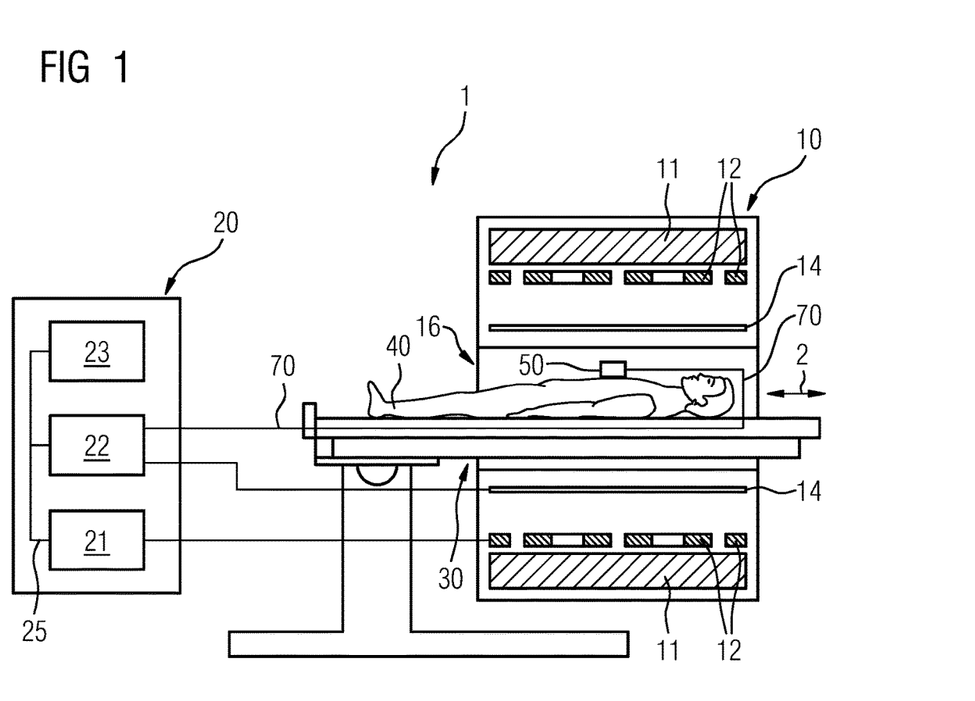
FIG. 1 depicts a schematic representation of a magnetic resonance tomography scanner according to an embodiment.

FIG. 1 is a schematic representation of an embodiment of a magnetic resonance tomography scanner 1.

The magnet unit 10 includes a field magnet 11 that generates a static magnetic field B0 for aligning nuclear spins of specimens or in a body of a patient 40 in a receiving region. The receiving region is arranged in a patient tunnel 16 extending in a longitudinal direction 2 through the magnet unit 10. The field magnet 11 may be a superconducting magnetic that may provide magnetic fields with a magnetic flux density of up to 3T, and, with the latest devices, even higher than this. For lower field strengths, however, it is also possible to use permanent magnets or electromagnets with normal-conducting coils.

Furthermore, the magnet unit 10 includes gradient coils 12 configured, for spatial differentiation of the acquired imaging regions in the examination volume, to overlay the magnetic field B0 with variable magnetic fields in three spatial directions. The gradient coils 12 may be coils made of normal-conducting wires able to generate fields orthogonal to one another in the examination volume.

The magnet unit 10 also includes a body coil 14 configured to emit a radio-frequency signal fed via a signal line into the examination volume and to receive resonance signals emitted by the patient 40 and to output them via the signal line. Moreover, the magnetic resonance tomography scanner includes one or more local coils 50 arranged in the patient tunnel 16 close to the patient 40.

A control unit 20 supplies the magnet unit 10 with the different signals for the gradient coils 12 and the body coil 14 and evaluates the signals received.

Thus, the control unit 20 includes a gradient control 21 configured to supply the gradient coils 12 via supply lines with variable currents that provide the desired gradient fields in the examination volume in a temporally coordinated manner.

Furthermore, the control unit 20 includes a radio-frequency unit 22 configured to generate a radio-frequency pulse with a prespecified temporal course, amplitude, and spectral power distribution for the excitation of a magnetic resonance of the nuclear spins in the patient 40. Herein, it is possible to achieve pulse power levels in the region of kilowatts. The individual units are connected to one another by a signal bus 25.

The radio-frequency signal generated by the radio-frequency unit 22 is fed via a signal connection 31 of the patient bench 30 and divided between one or more local coils 50 and emitted into the body of the patient 40 in order to excite the nuclear spins there.

The local coil 50 may receive a magnetic resonance signal from the body of the patient 40, because the short distance means the signal-to-noise ratio (SNR) of the local coil 50 is better than with reception by the body coil 14. The MR signal received by the local coil 50 is conditioned in the local coil 50 and forwarded to the radio-frequency unit 22 of the magnetic resonance tomography scanner 1 for evaluation and image acquisition. The signal connection 31 may also be used for this, but separate signal connections or wireless transmission are also conceivable. It is also conceivable for individual local coils or other antennas to be provided for reception.

Figure 2:
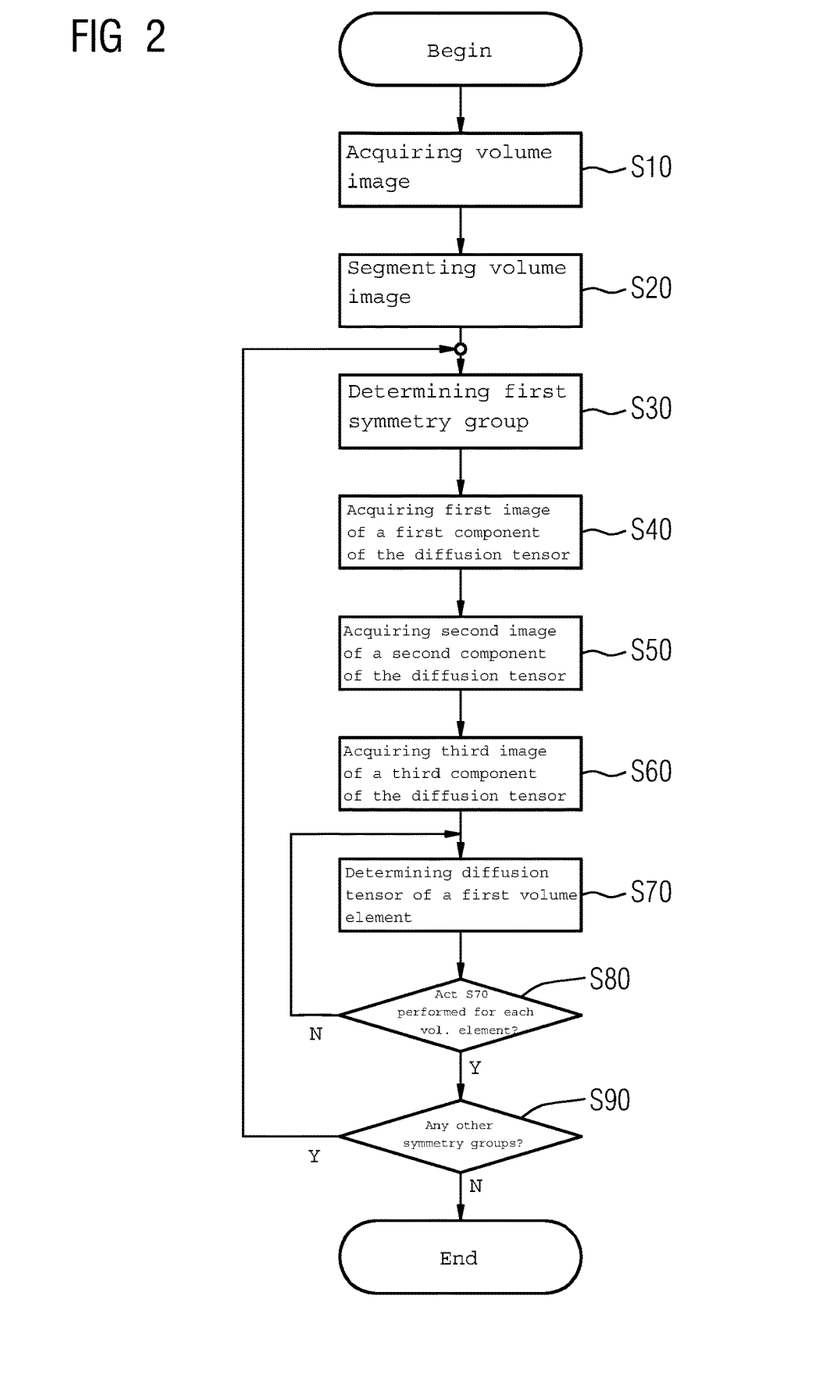
FIG. 2 depicts a schematic representation of a flow diagram of a method according to an embodiment.

FIG. 2 is a schematic flow diagram of the method. The sequence of acts only shows the sequence for an exemplary embodiment and is not restrictive with respect to the method. It is in particular also possible for individual acts to be performed in another sequence.

In act S10, a volume image of the examination object is acquired by imaging magnetic resonance tomography without diffusion encoding. Exemplary sequences are gradient-echo sequences (GRE) or echo-planar sequences (EPI). As a result, act S10 produces a measure for the density of a substance, (e.g., hydrogen nuclei or protons in body fat or water), for the volume elements to be examined. The volume elements may be a small sub-volume of a body, for example an individual slice of a cross section, a three-dimensional sub-volume or an individual organ. The control unit may store the result of Act S10 in a memory.

In act S20, the volume image acquired in act S10 is segmented to differentiate between physiologically different regions. For example, the contrast jump alone enables vessels such as veins or hollow muscles, in particular the heart, to be differentiated from the cavities surrounding them and thus regions of a substantially uniform contrast value to be separated from regions with a significantly different contrast value by the control unit and subsequently a diffusion-relevant symmetry property of the examination object in a plane of symmetry to be determined.

Figure 3:
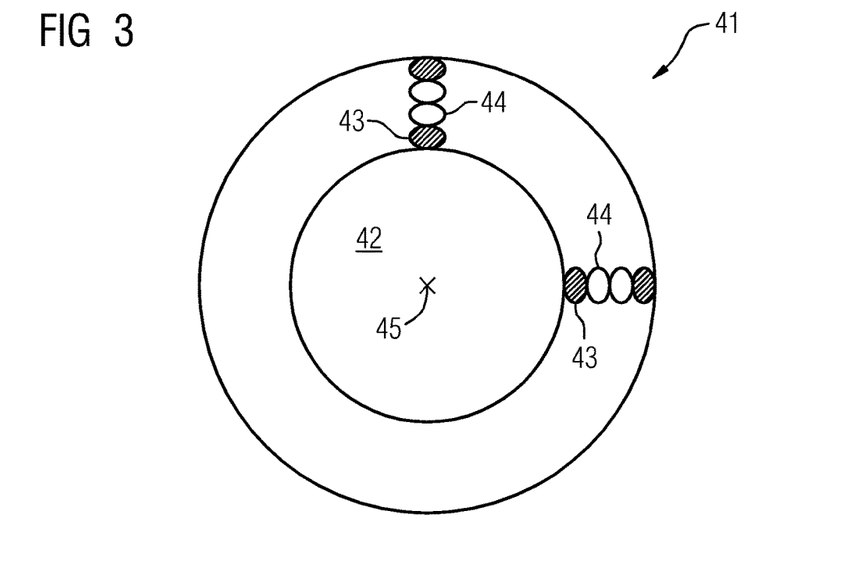
FIG. 3 depicts a schematic cross section through an exemplary blood vessel.

FIG. 3 shows as an example a schematic cross section through a blood vessel or a vein 41. The cells of the intima 43 or cell walls and cells of the media 44 are arranged about a virtually circular lumen 42. Herein, the cells are arranged in a virtually circular shape around the center point 45 of the vein.

In act S30, a first symmetry group of volume elements of the examination object with a first symmetry property is determined. In the example shown in FIG. 3, this may be the rotational symmetry about the center point 45. The symmetry of the cells is also reflected in a corresponding rotational symmetry of the diffusion properties of the cells. In this case, the first symmetry group may be the group of cells in the intima 43. However, in this example, there are yet further symmetry groups, for example, the symmetry group of the cells in the media 44. These differ from the cells of the intima 43 in that, in all directions of the depicted plane of symmetry, they are surrounded by cells of the vascular wall. It is, therefore, to be expected that the cells of the intima 43 differ from the cells of media 44 at least in their diffusion properties in the direction of the center point and indicate an individual symmetry group. In one conceivable embodiment of the method, therefore, acts S30 and S90 are repeated for a plurality of symmetry groups, wherein the volume data of the first image and the second image acquired for the entire examination object is used. However, alternatively, it is in each case possible for a first image and a second image to be acquired for a small sub-volume with the symmetry group, in order, for example, to save storage space.

In act S40, a first image of a first component of the diffusion tensor is acquired in a first direction at a first angle to the plane of symmetry by the magnetic resonance tomography scanner 1.

Figure 4:
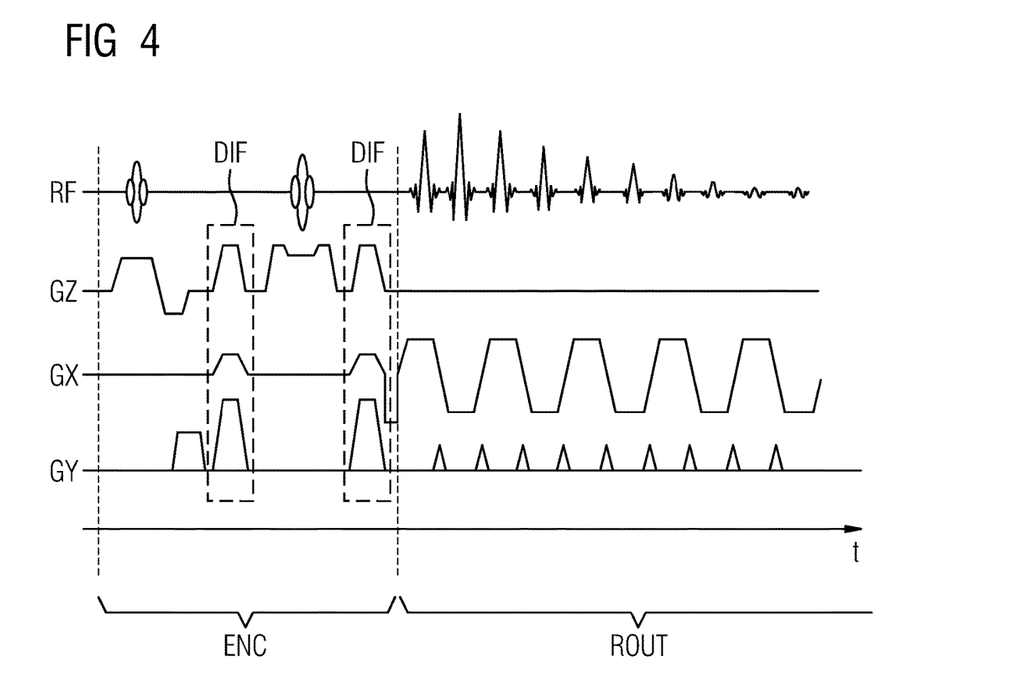
FIG. 4 depicts a schematic representation of an exemplary sequence for the determination of a component of the diffusion tensor.

FIG. 4 is schematic representation of an exemplary sequence. Herein, the time is plotted on the horizontal axis, the field strength of the radio signals is plotted in the vertical axis, and the magnetic field strength of the gradient signal in the x-, y-, and z-direction in any, non-true-to-scale units.

The sequence is divided into two segments designated ENC for encoding, (e.g., in this case with direction- and diffusion-sensitive excitation of the spins), and ROUT for read out of the location-dependent spin density.

In the segment ENC, a slice of spins of the examination object, which is limited in the z-direction, is excited by a 90 degree and a 180 degree radio-frequency pulse with the application of a z gradient. Spin-sensitive phase modulation takes place by the gradient pulses, which are designated DIF. Herein, the simultaneous application of three gradient components in x-, y-, and z-direction enables the selection of a predetermined direction of the diffusion in which diffusion measurement is to be sensitive. Herein, the diffusion-sensitive excitation is sensitive for a diffusion distance, which is much smaller than the volume elements of the MR image. Only excited spins, which, in this direction, move by more than this distance, no longer contribute to the signal that is subsequently read out.

In the segment ROUT for the subsequent acquisition of the spin density, in this example, an echo-planar-sequence (EPI) is used. The received RF signals shown are not true-to-scale with respect to the excitation pulses and, in reality, are several orders of magnitude smaller.

The result of the sequence in FIG. 3 is a measure for a spin density in the volume elements of the examination object, wherein the spin density is reduced by the spins, which, during the excitation ENC between the DIF gradient pulses, have moved by more than the distance in a direction predetermined by the DIF gradients. The control unit may also store this value for the volume elements.

In act S50, a second image of a second component of the diffusion tensor is acquired in a second direction at a second angle to the plane of symmetry, wherein the magnitude of the second angle differs from the first angle. Herein, act S50 may be performed with the same sequence already explained with respect to act S40 and FIG. 3. Herein, act S50 only differs in the diffusion direction, which is predetermined by a changed ratio of the direction components of the gradient pulses DIF. Due to the symmetry of the preceding sign of the diffusion tensor, it is herein necessary for the angle of the directions with respect to the diffusion plane also to differ in its magnitude and not merely only in the preceding sign. The magnitude may also differ significantly, for example, by at least 20 or 30 degrees, hence the diffusion tensor may be determined in all three coordinates with a sufficient accuracy and SNR.

In one embodiment of the method, it is also conceivable for, in act S60 corresponding to acts S30 and S40, an image with a component of the diffusion tensor to be acquired in a third direction, wherein the first direction, the second direction and the third direction span an orthogonal coordinate system. It is then possible to use the three images from acts S30, S40, and S50 to determine a scalar diffusion constant for each volume element directly and without using the symmetry.

In act 70, the diffusion tensor of a first volume element of the first symmetry group is determined by the control unit. Herein, the method advantageously utilizes the symmetry property. It is evident From FIG. 3, assuming that the diffusion has the same symmetry properties, that the measured values for a diffusion direction for all volume elements correspond to the measured values for an individual volume element at all azimuth angles in the plane of symmetry.

Therefore, the method transfers the acquired measured values of a second volume element or a plurality of second volume elements onto the first volume element by symmetry mapping. In the example in FIG. 3, the symmetry mapping is a rotation about the center point 45. The measured values for the cells depicted at the top of diagram are transformed into the measured values for the cells depicted on the right by rotation by 90 degrees in the clockwise direction in measured values.

A first and/or second image may acquire a measured value for a plurality of second volume elements. In this way, measured values for a plurality of directions of the diffusion encoding in the plane for the first volume element are acquired simultaneously within one individual image acquisition. Because a plurality of measured values of different second volume elements are imaged onto the first volume element, the equation system for the determination of the diffusion-tensor components in the plane of symmetry is over-determined. It is then advantageously possible to use the over-determination of the system to compensate errors in the measured values, for example by a least-mean-square method (LMS). This also enables the accuracy of the diffusion-tensor components determined to be improved compared to simple averaging, with which, initially, the tensor for the first volume element and the second volume elements are determined individually and then averaged, since, by this time, the additional information contained in the vectors has been lost.

To obtain a complete 3-dimensional diffusion tensor, in act S70 it is furthermore necessary to map the second components of the diffusion tensor obtained in the second image from a plurality of second volume elements of the first symmetry group onto the first volume element by symmetry mapping dependent upon the symmetry, the position of the first volume element, and the position of the second volume element, and to determine therefrom further linearly independent diffusion-tensor components and thus to complete the tensor. The procedure is identical to the first image described above.

Herein, act S70 may also be carried out by the control unit 20.

In act S80 of an embodiment of the method, a check is performed as to whether act S70 has already been performed for all volume elements of the first symmetry group. It is also possible to select another first volume element and corresponding second volume elements from the first symmetry group and to repeat act S70 for these in order to determine a diffusion tensor for all volume elements of the first symmetry group.

However, alternatively it is also conceivable to map a specific diffusion tensor for a first volume element onto the selected second volume element by symmetry mapping in dependence on the symmetry property of the symmetry group and the position of the first volume element and a selected second volume element.

Finally, in act S90 of an embodiment of the method, a check is performed as to whether there are any further symmetry groups within the examination object and whether it is also necessary to determine a diffusion tensor for these. It is optionally possible for the method for this further symmetry group to be carried in that acts S30 to S70 or act S80 is/are carried out for this new symmetry group with the corresponding plane of symmetry.

In the method, it is herein in principle irrelevant whether act S10 with the acquisition of a diffusion-dependent volume image and acts S40 and S50 with the acquisition of first and second diffusion-dependent images are performed first, the measured data completely stored and only then an evaluation performed according to acts S20, S30, and S70, or whether the evaluation is first performed for individual sub-volumes, for example, and only then further volume images and first or second diffusion-dependent images of other volumes formed and subsequently evaluated.

It is also conceivable for an individual sub-volume to have different symmetries and therefore an evaluation according to acts S30 and S70 to be performed for the same volume image and the same first and second diffusion-dependent image with different symmetries in each case.

However, in the case of a subsequent evaluation, however, it is necessary for two diffusion-dependent images at two angles to the plane of symmetry with different magnitudes to be acquired for each symmetry. It may therefore be advantageous initially to acquire and store three or more diffusion-dependent images at different angles.

Figure 5:
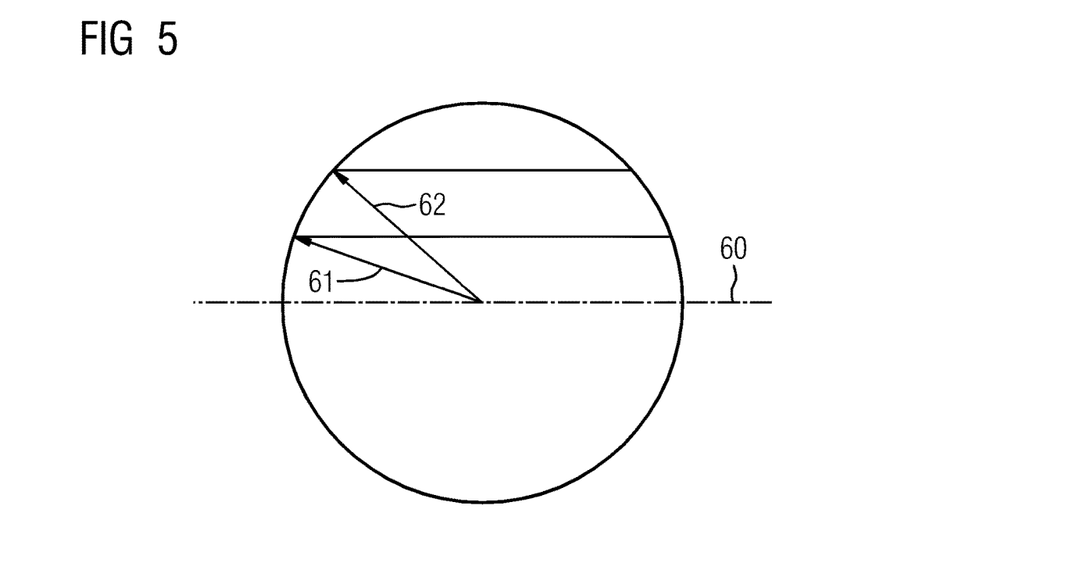
FIG. 5 depicts a schematic representation of the directions the diffusion-selective image in one embodiment.

FIG. 5 is a two-dimensional schematic representation of directions of the diffusion-selective image in one embodiment. The direction of the diffusion sensitivity determined by the gradients DIF in FIG. 4 has different angles of elevation with respect to the plane of symmetry 60. Images in these two exemplary directions are sufficient for a determination of the diffusion tensor using the symmetry.

Figure 6:
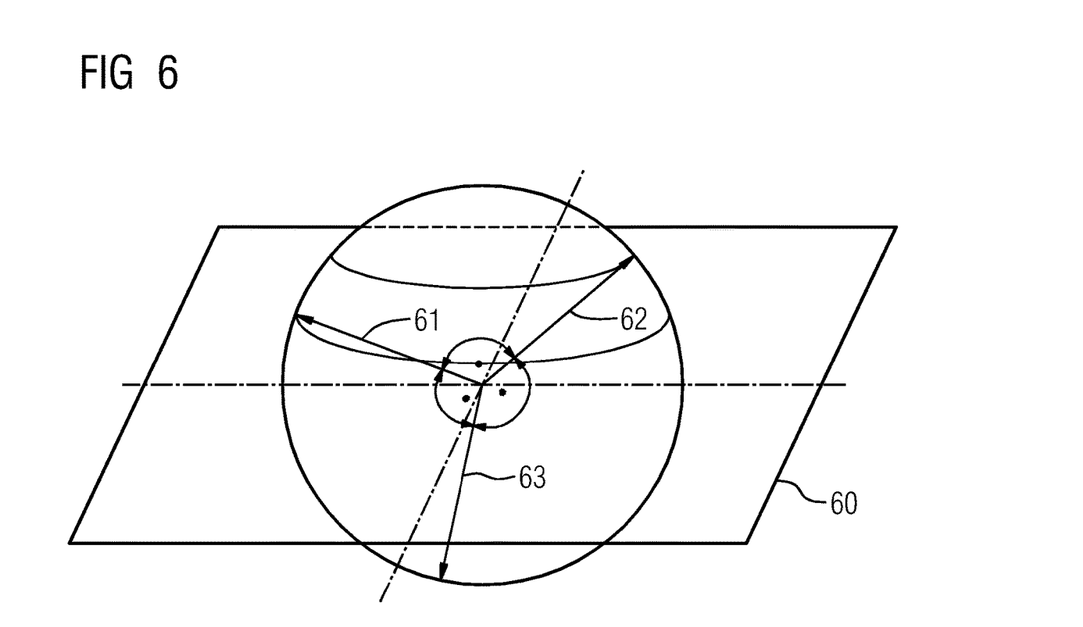
FIG. 6 depicts a schematic representation of the directions of the diffusion-selective image in another embodiment.

FIG. 6 is a three-dimensional schematic representation of directions of the diffusion-selective image in another embodiment. This has three directions for diffusion-sensitive imaging, wherein the three directions are perpendicular to one another and span a Cartesian coordinate system. This arrangement additionally enables the determination of a scalar value of the diffusion tensor, which is independent of the symmetry, and advantageously a check to be performed as to whether the assumed symmetry is also applicable to the volume elements. Simultaneously, this scalar diffusion value is also an important parameter for the evaluation of the cells of a volume element.

However, it may be the case that two of these directions in FIG. 6 coincide with a possible plane of symmetry. To enable an evaluation of any kind at a later time, it is therefore necessary, to perform fourth diffusion-dependent imaging under a fourth direction that is inclined with respect to the planes that are each spanned by two directions.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for determining a diffusion tensor of an examination object by a magnetic resonance tomography scanner, the method comprising:

acquiring, by the magnetic resonance tomography scanner, a volume image of the examination object by imaging magnetic resonance tomography without diffusion encoding;

segmenting, by a control unit of the magnetic resonance tomography scanner, the volume image and determining a diffusion-relevant first symmetry property of the examination object in a plane of symmetry;

determining, by the control unit, a first symmetry group of volume elements of the examination object with the first symmetry property;

acquiring, by the magnetic resonance tomography scanner, a first image of a first component of the diffusion tensor in a first direction at a first angle to the plane of symmetry by imaging magnetic resonance tomography with diffusion encoding;

acquiring, by the magnetic resonance tomography scanner, a second image of a second component of the diffusion tensor in a second direction at a second angle to the plane of symmetry, wherein a magnitude of the second angle differs from a magnitude of the first angle by the imaging magnetic resonance tomography with diffusion encoding;

mapping, by the control unit, the first components obtained in the first image and the second components obtained in the second image from a plurality of second volume elements of the first symmetry group onto a first volume element by symmetry mapping, wherein the symmetry mapping is dependent upon the plane of symmetry and respective positions of the first and second volume elements; and determining, by the control unit, the diffusion tensor of the first volume element of the first symmetry group of the examination object in the plane of symmetry.

2. The method of claim 1, wherein determining of the diffusion tensor is repeated for another first volume element.

3. The method of claim 1, wherein the determining of the first symmetry group and the determining of the diffusion tensor are repeated for a plurality of symmetry groups.

4. The method of claim 3, wherein the acquiring of the first image is repeated for a plurality of first angles.

5. The method of claim 4, further comprising:
acquiring a third image of a third component of the diffusion tensor in a third direction at a third angle to the plane of symmetry, wherein a magnitude of the third angle differs from the magnitude of the first angle and the magnitude of the second angle,
wherein the first direction, the second direction, and the third direction span an orthogonal coordinate system.

6. The method of claim 3, further comprising:
acquiring a third image of a third component of the diffusion tensor in a third direction at a third angle to the plane of symmetry, wherein a magnitude of the third angle differs from the magnitude of the first angle and the magnitude of the second angle,
wherein the first direction, the second direction, and the third direction span an orthogonal coordinate system.

7. The method of claim 2, wherein the acquiring of the first image is repeated for a plurality of first angles.

8. The method of claim 1, wherein the acquiring of the first image is repeated for a plurality of first angles.

9. The method of claim 1, wherein the diffusion tensor is completely determined with six or fewer magnetic resonance images.

10. The method of claim 1, wherein the diffusion tensor is completely determined with four magnetic resonance images.

11. The method of claim 1, further comprising:
acquiring a third image of a third component of the diffusion tensor in a third direction at a third angle to the plane of symmetry, wherein a magnitude of the third angle differs from the magnitude of the first angle and the magnitude of the second angle,
wherein the first direction, the second direction, and the third direction span an orthogonal coordinate system.

12. A magnetic resonance tomography scanner configured to determine a diffusion tensor of an examination object, the magnetic resonance tomography scanner comprising:
a control unit;
a field magnet configured to generate a B0 field;
gradient coils and a gradient control configured to generate magnetic field gradients in all spatial directions; and
a radio-frequency unit and antennas configured to transmit an excitation pulse and receive a spin signal from the examination object,
wherein the magnetic resonance tomography scanner is configured to acquire a volume image of the examination object by imaging magnetic resonance tomography without diffusion encoding,
wherein the control unit is configured to segment the volume image and to determine a diffusion-relevant first symmetry property of the examination object in a plane of symmetry,
wherein the control unit is configured to determine a first symmetry group of volume elements of the examination object having the first symmetry property,
wherein the magnetic resonance tomography scanner is configured to acquire a first image of a first component of the diffusion tensor in a first direction at a first angle to the plane of symmetry by imaging magnetic resonance tomography with diffusion encoding,
wherein the magnetic resonance tomography scanner is configured to acquire a second image of a second component of the diffusion tensor in a second direction at a second angle to the plane of symmetry by the imaging magnetic resonance tomography with diffusion encoding, wherein a magnitude of the second angle differs from a magnitude of the first angle,
wherein the control unit is configured to map the first components obtained in the first image and the second components obtained in the second image from a plurality of second volume elements of the first symmetry group onto a first volume element by symmetry mapping, wherein the symmetry mapping is dependent upon the plane of symmetry and respective positions of the first and second volume elements; and
wherein the control unit is configured to determine a diffusion tensor of the first volume element of the first symmetry group of the examination object in the plane of symmetry.

13. A computer program product configured to be loaded directly into a processor of a programmable control unit, the computer program product having program code configured to, with the processor, cause the control unit to at least perform:
acquire a volume image of an examination object by imaging magnetic resonance tomography without diffusion encoding;
segment the volume image and determine a diffusion-relevant first symmetry property of the examination object in a plane of symmetry;
determine a first symmetry group of volume elements of the examination object with the first symmetry property;

acquire a first image of a first component of a diffusion tensor in a first direction at a first angle to the plane of symmetry by imaging magnetic resonance tomography with diffusion encoding;

acquire a second image of a second component of the diffusion tensor in a second direction at a second angle to the plane of symmetry by the imaging magnetic resonance tomography with diffusion encoding, wherein a magnitude of the second angle differs from a magnitude of the first angle;

map the first components obtained in the first image and the second components obtained in the second image from a plurality of second volume elements of the first symmetry group onto a first volume element by symmetry mapping, wherein the symmetry mapping is dependent upon the plane of symmetry and respective positions of the first and second volume elements; and determine the diffusion tensor of the first volume element of the first symmetry group of the examination object in the plane of symmetry.

14. A non-transitory computer-readable storage medium with electronically readable control information stored thereupon in a control unit of a magnetic resonance tomography scanner, the storage medium configured to:

acquire a volume image of an examination object by imaging magnetic resonance tomography without diffusion encoding;

segment the volume image and determine a diffusion-relevant first symmetry property of the examination object in a plane of symmetry;

determine a first symmetry group of volume elements of the examination object with the first symmetry property;

acquire a first image of a first component of a diffusion tensor in a first direction at a first angle to the plane of symmetry by imaging magnetic resonance tomography with diffusion encoding;

acquire a second image of a second component of the diffusion tensor in a second direction at a second angle to the plane of symmetry by the imaging magnetic resonance tomography with diffusion encoding, wherein a magnitude of the second angle differs from a magnitude of the first angle;

map the first components obtained in the first image and the second components obtained in the second image from a plurality of second volume elements of the first symmetry group onto a first volume element by symmetry mapping, wherein the symmetry mapping is dependent upon the plane of symmetry and respective positions of the first and second volume elements; and determine the diffusion tensor of the first volume element of the first symmetry group of the examination object in the plane of symmetry.

15. The method of claim 1, wherein the diffusion tensor defines a diffusion of water or a hydrogen-containing substance in the examination object.

* * * * *